United States Patent [19]
Juskey et al.

[11] Patent Number: 5,371,404
[45] Date of Patent: Dec. 6, 1994

[54] THERMALLY CONDUCTIVE INTEGRATED CIRCUIT PACKAGE WITH RADIO FREQUENCY SHIELDING

[75] Inventors: Frank J. Juskey; Anthony B. Suppelsa, both of Coral Springs, Fla.

[73] Assignee: Motorola, Inc., Schaumburg, Ill.

[21] Appl. No.: 13,391

[22] Filed: Feb. 4, 1993

[51] Int. Cl.$^5$ ............... H01L 49/00; H01L 23/28; H01L 23/48; H01L 29/40
[52] U.S. Cl. .................. 257/659; 257/778; 257/786; 257/787; 257/792; 257/795; 257/796
[58] Field of Search ........... 257/787, 778, 659, 786, 257/792, 796, 795; 174/35

[56] References Cited

U.S. PATENT DOCUMENTS

| | | | |
|---|---|---|---|
| 2,967,984 | 1/1961 | Jamison | 257/795 |
| 3,280,019 | 10/1966 | Harding et al. | 257/783 |
| 3,439,255 | 4/1969 | Carnes et al. | 322/28 |
| 3,564,109 | 2/1971 | Ruechardt | 257/795 |
| 3,777,221 | 12/1973 | Tatusko et al. | 317/101 CP |
| 4,177,480 | 12/1979 | Hintzmann et al. | 257/787 |
| 4,278,991 | 7/1981 | Ritchie et al. | 257/796 |
| 4,811,081 | 3/1989 | Lyden | 257/783 |
| 4,825,284 | 4/1989 | Soga et al. | 257/706 |
| 5,113,241 | 5/1992 | Yanagida et al. | 257/783 |
| 5,175,613 | 12/1992 | Barker, III et al. | 257/713 |
| 5,218,234 | 6/1993 | Thompson et al. | 257/792 |

FOREIGN PATENT DOCUMENTS 54-128276  4/1979  Japan .................. 257/795

Primary Examiner—Jerome Jackson
Assistant Examiner—T. M. Arroyo
Attorney, Agent, or Firm—Dale W. Dorinski

[57] ABSTRACT

A semiconductor device package comprises a substrate (10), a flip-chip (16), an underfill adhesive (25), and a thermally and electrically conductive plastic material (20). A leadless circuit carrying substrate has a metallization pattern (13) on a first side (15), one portion of the metallization pattern being a circuit ground (17). The second side has an array of surface mount solder pads (24) electrically connected to the metallization pattern by means of at least one conductive via (26) through the substrate. A semiconductor device (16) is flip-chip mounted to the metallization pattern by means of metal bumps (22). An underfill adhesive (25) fills the gap between the semiconductor device and the substrate. A thermally and electrically conductive plastic material (20) containing metal particles is transfer molded to encapsulate the semiconductor device, the underfill adhesive, and a portion of the first side of the leadless circuit carrying substrate, forming a cover. The conductive plastic material is electrically connected to the circuit ground to shield the semiconductor device from radio frequency energy, and is mechanically attached to the semiconductor device to dissipate heat. Fins (28) may be molded into the conductive plastic material to further enhance the ability to dissipate heat.

16 Claims, 6 Drawing Sheets

THERMALLY CONDUCTIVE INTEGRATED CIRCUIT PACKAGE WITH RADIO FREQUENCY SHIELDING

CROSS REFERENCE TO RELATED APPLICATIONS

This application is related to U.S. Pat. No. 5,153,379 by Guzik et al., issued Oct. 6, 1992, entitled "Shielded Low-Profile Electronic Component Assembly", which relates to an encapsulated electronic component with a metal shield, and to U.S. Pat. No. 5,241,133 by Mullen et al., issued Aug. 31, 1993, entitled "Leadless Pad Array Chip Carrier", which relates to an encapsulated integrated circuit, and also to U.S. patent application Ser. No. 650,326, filed Jan. 31, 1991, which relates to an encapsulated semiconductor device coated with a vacuum deposited metal layer, all assigned to Motorola, Inc.

TECHNICAL FIELD

This invention relates generally to semiconductor device packages and more specifically to thermally conductive radio frequency shielded semiconductor device packages.

BACKGROUND

Semiconductor device packages or integrated circuit (IC) chip carriers find use in a variety of high-density electronics applications. The integrated circuits or semiconductor devices are typically protected from the external environment by transfer molding a thermoset or thermoplastic resin about the device. This package provides protection from dust, humidity and other environmental factors which can destroy the delicate circuitry.

A major problem associated with these types of packages is that they do not provide shielding from electromagnetic radiation, such as radio frequency interference (RFI) or electromagnetic interference (EMI). This ability to shield high-frequency circuits, especially in electronic equipment such as two-way radios, is critical. Conventional shielding systems are generally characterized by a metallic enclosure constructed to surround the device to be shielded. This enclosure acts either to protect the electrical equipment from external RFI or EMI signals or to prevent the escape of RFI or EMI signals generated by the device. Typically, these shielded enclosures are made from a conductive material that is electrically coupled to an appropriate ground. In the prior art, shielded enclosures have been made by attaching a drawn metallic casing over the transfer molded package and soldering the metal casing to a substrate connected to the device. Unfortunately, this method of shielding is costly and cumbersome because of:

A) High temperatures generated during the soldering process for attaching the metal shield to the device. Heat generated by the soldering process may be conducted directly to the IC and can damage it. Due care is required in order to control the soldering process to prevent jeopardizing the quality of the IC.

B) The additional thickness or bulk required when adding a metal enclosure. The increase in the overall size of the shielded package is substantial, due to the additional thickness of the shield. This results in a package that is larger than optimum.

C) The additional cost associated with the soldering operation. The step of soldering the shield requires additional assembly time and labor, adding further cost to the final package. Providing shielding for integrated circuits in this way requires special mounting and holding fixtures for the shield and the IC package.

Conventional shielded systems also do not provide for dissipation of thermal energy generated by the device. Numerous methods of heat sinking are known in the art, and generally comprise attaching a metal heat sink to the IC package. This approach is not optimal because thermal energy must still travel through the insulating plastic molding compound prior to reaching the metal heat sink. Radio Frequency (RF) power ICs such as amplifiers present special shielding and thermal dissipation problems that are not addressed by the conventional art.

As a result, a need exists for a method to provide RFI shielding and enhanced thermal conductivity to a high-density integrated circuit package that is economical, does not generate excessive temperatures, and provides a low-profile, high-density package.

SUMMARY OF THE INVENTION

Briefly, according to the invention, there is provided a semiconductor device package comprising a substrate, a flip-chip, an underfill adhesive, and a thermally and electrically conductive plastic material. A leadless circuit carrying substrate has a metallization pattern on a first side, one portion of the metallization pattern being a circuit ground. The other side of the substrate has an array of surface mount solder pads electrically connected to the metallization pattern by means of at least one via or through-hole. A semiconductor device is flip-chip mounted to the metallization pattern by means of metal bumps. An underfill adhesive fills the gap between the semiconductor device and the substrate. A thermally and electrically conductive plastic material is transfer molded to encapsulate the semiconductor device, the underfill adhesive, and a portion of the first side of the substrate, forming a cover. The conductive plastic material is electrically connected to the circuit ground to shield the semiconductor device from radio frequency energy, and is mechanically attached to the semiconductor device to dissipate heat.

In an alternate embodiment of the invention, thermally conductive fins are molded into the thermally and electrically conductive plastic material to provide enhanced heat dissipation.

DETAILED DESCRIPTION OF THE PREFERRED EMBODIMENTS

Figure 1:
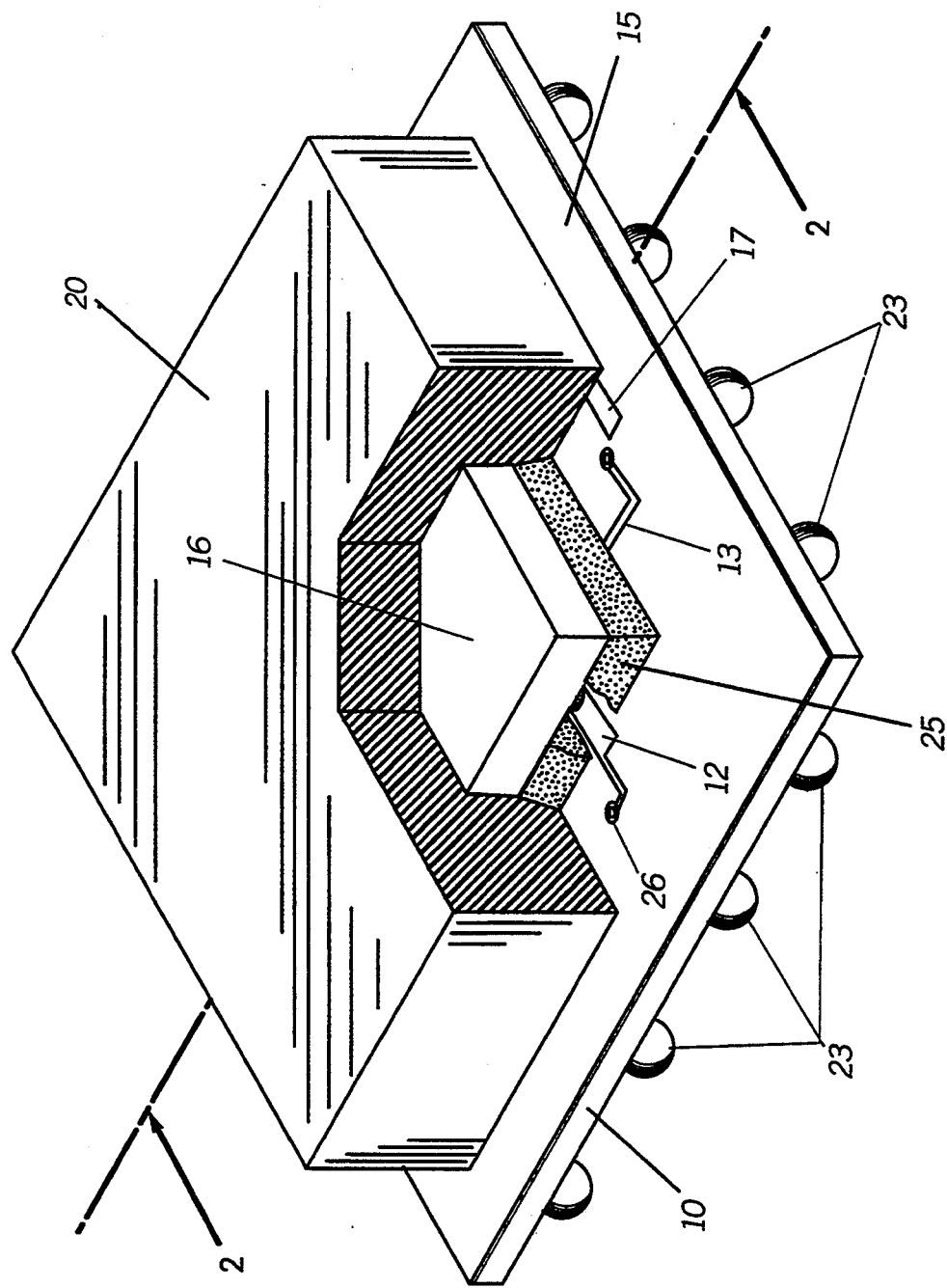
FIG. 1 is a cut-away isometric view of an integrated circuit package in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a substrate 10 is provided as a circuit carrier. The substrate may be made from any one of a number of materials commonly used in the industry, such as epoxy, polyester, polyimide, polyetherimide, polytetrafluoroethylene, glass-reinforced printed circuit board material, metal, ceramic, etc., and may be rigid or flexible. Substrate thicknesses vary from approximately 0.02 mm to 7 mm, with thicknesses ranging from 0.1 mm to 2 mm being preferred. The substrate 10 has a metallization pattern 13 on an upper or first side 15. The metallization pattern 13 comprises bonding pads 12 that correspond to bond pads on an integrated circuit (IC) 16. One portion of the metallization pattern 13 is a grounding pad 17 that comprises a circuit ground.

Figure 2:
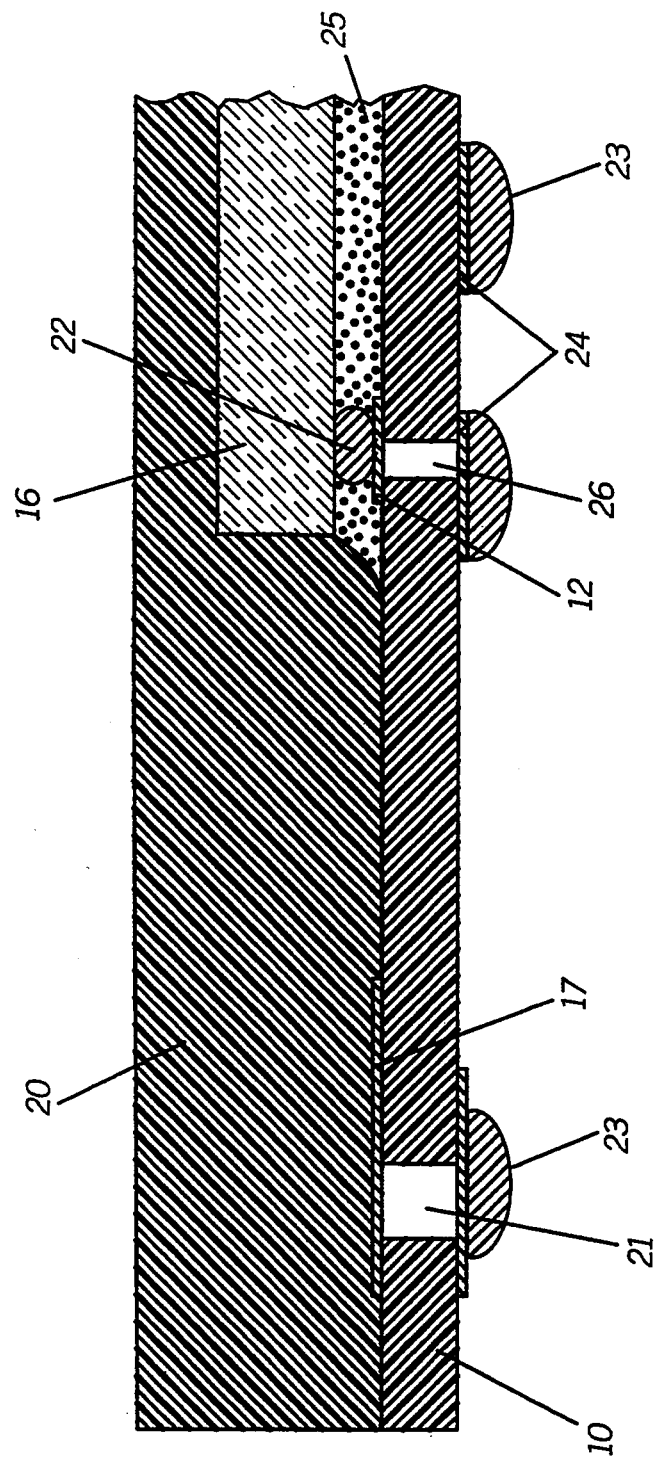
FIG. 2 is a partial cross-sectional view of FIG. 1 through section 2—2 in accordance with the invention.

Referring now to FIG. 2, on a second side of the substrate 10 is a co-planar array of surface mount solder pads 24. The bonding pads 12 are electrically connected to the surface mount solder pads 24 by means of conductive through holes 26. The solder pads 24 comprise an attachment means for surface mounting the semiconductor device package 5 to a larger substrate such as a mother board. Surface mounting technology using surface mount pads is well known to those skilled in the art and is also referred to as leadless technology. Hence, the semiconductor device package 5 may also be referred to as a leadless package. Solder bumps 23 may be optionally attached to the solder pads 24 in order to provide ease of soldering the package to a larger substrate or circuit board. In another embodiment of the invention, pins 18 may be attached to the solder pads 24 so as to form a leaded package, or the solder pads could be replaced with pins that fit into holes in the substrate, and are electrically connected to the metallization pattern 13. Such packages would then have an array of pins 18 protruding below the surface of the substrate 10, forming a pin grid array (PGA) package.

An IC 16, such as a semiconductor die or chip, is flip-chip bonded to the bonding pads 12 and the substrate 10. This mechanical and electrical attachment to the metallization pattern 13 is typically performed by means of metal bumps 22. The metal bumps 22 are typically solder bumps and the IC 16 is attached using controlled-collapse-chip-connection (C4) technology. The metal bumps may comprise solder or may also be other materials such as gold, indium, tin, lead, or alloys of these materials. When the IC 16 is flip-chip bonded to the substrate 10, the active surface of the IC is facing the substrate. There now exists a small gap or space between the IC 16 and the upper surface 15 of the substrate 10. This gap is filled with an underfill material 25 in order to provide a more robust mechanical connection between the IC and the substrate, and to provide environmental protection and electrical isolation to the active surface of the IC. The underfill material 25 is typically an adhesive, such as an epoxy or an acrylic and has a thermal coefficient of expansion that approximates that of the die and/or the substrate. Examples of underfill materials have been shown in the literature.

The assembly is now encapsulated by placing it into a transfer molding cavity and transfer molding a thermoplastic or thermoset molding compound 20. During this operation, the molding compound 20 flows around the IC 16, encapsulating it. The molding compound 20 also encapsulates the underfill material 25 and covers portions or substantially all of the upper surface 15 of the substrate 10. Molding compound 20 comprises a thermally and electrically conductive material, such as an epoxy, having at least one filler, for example, a metallic element or alloy, which substantially contributes to the thermal and electrical conductive properties of the molding compound. The molding compound 20 is typically filled to approximately 70% to 75% with copper, aluminum, nickel, gold, silver, or similar type materials to provide electrical and thermal conductivity. Suitable encapsulating materials are sold by Nitto, Sumitomo (1033-B), Nippon Steel, Shinetsu, Ciba-Geigy, Hitachi (EN 4274, or EN 4072), Dexter-Hysol, Dow Chemical, or Shell Chemical.

Figure 3:
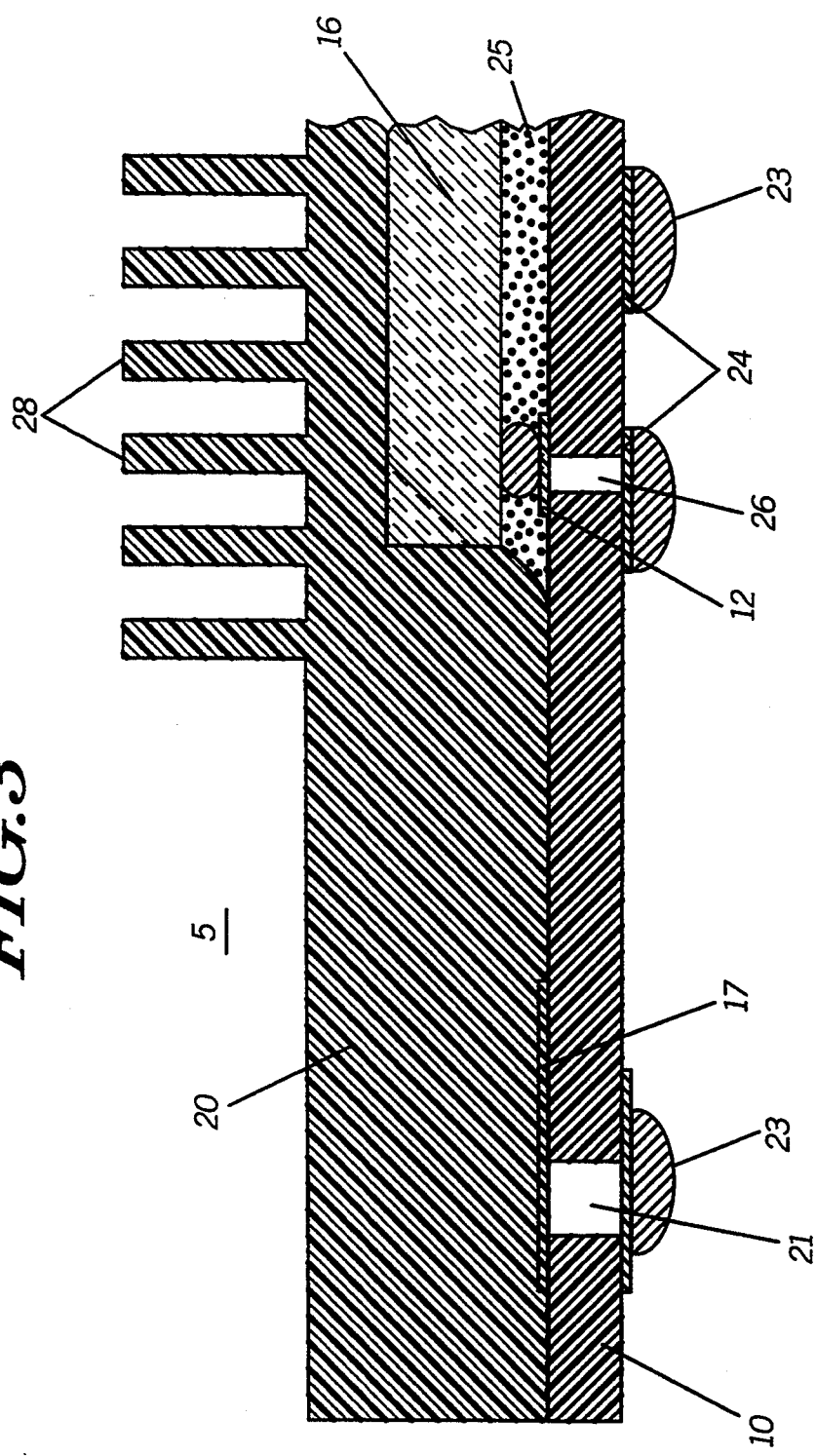
FIG. 3 is a cross-sectional view of an alternate embodiment of the invention.

The molding compound 20 is situated on the upper surface 15 of the substrate 10 such that it provides electrical and mechanical contact to the ground pad 17 and the back surface of the IC 16, which is frequently grounded. As shown in FIGS. 2 and 3, ground pad 17 is also electrically connected by means of a conductive through hole or via 21 to a surface mount solder pad 24 on the bottom side of the substrate 10. In this way, the electrically conductive molding compound 20 now forms not only a cover for the IC 16, but also provides an EMI/RFI shield around the IC in order to form a shielded package. By shielding the package in this manner, external metal shields, as taught in the prior art, are no longer necessary. This solves the problems of the prior art, such as high temperatures transmitted to the IC during the shield attachment process and the additional thickness or bulk associated with the shield.

Because the molding compound 20 contains a high amount of metal filler, it is also thermally conductive. The intimate contact between the molding compound 20 and the IC 16 provides a good thermal path to dissipate heat from the IC. Prior art packages encapsulated the IC 16 with unfilled molding compound which comprised a thermal insulator. The package of the instant invention provides improved thermal management of the IC 16.

Referring now to FIG. 3, it may be seen that the molding material 20 can be also formed to provide increased surface area on the top of the package. Features such as fins or protrusions 28 may be molded directly into the molding compound 20 during the transfer molding operation. Fins 28 provide increased surface area in the top of the package that serves to further enhance the heat-sinking capability of the package 5. FIG. 3 shows just one of many configurations that the fins 28 may assume. Other types of configurations that enhance the surface area of the top of the package 5 could provide equivalent thermal performance.

Figure 4:
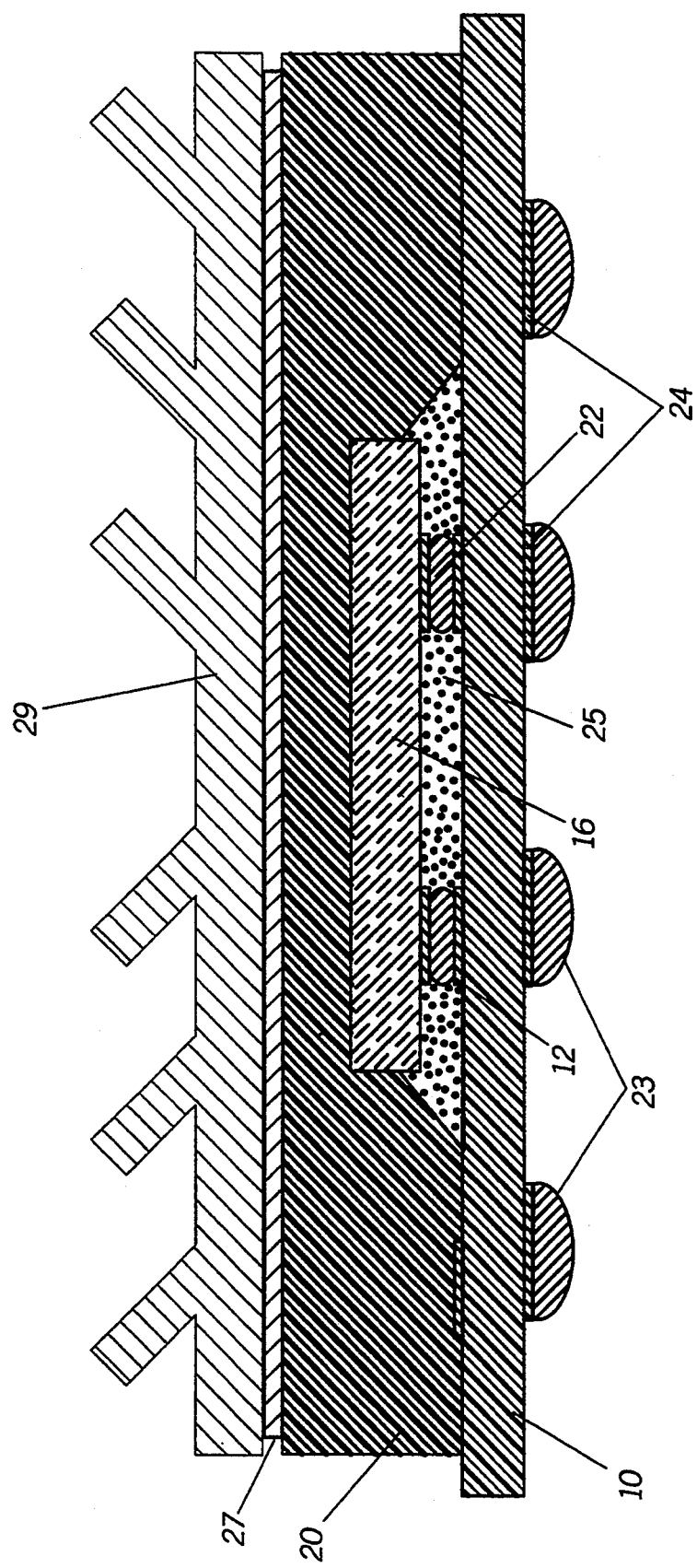
FIG. 4 is a cross-sectional view of a further embodiment of the invention.
Figure 5:
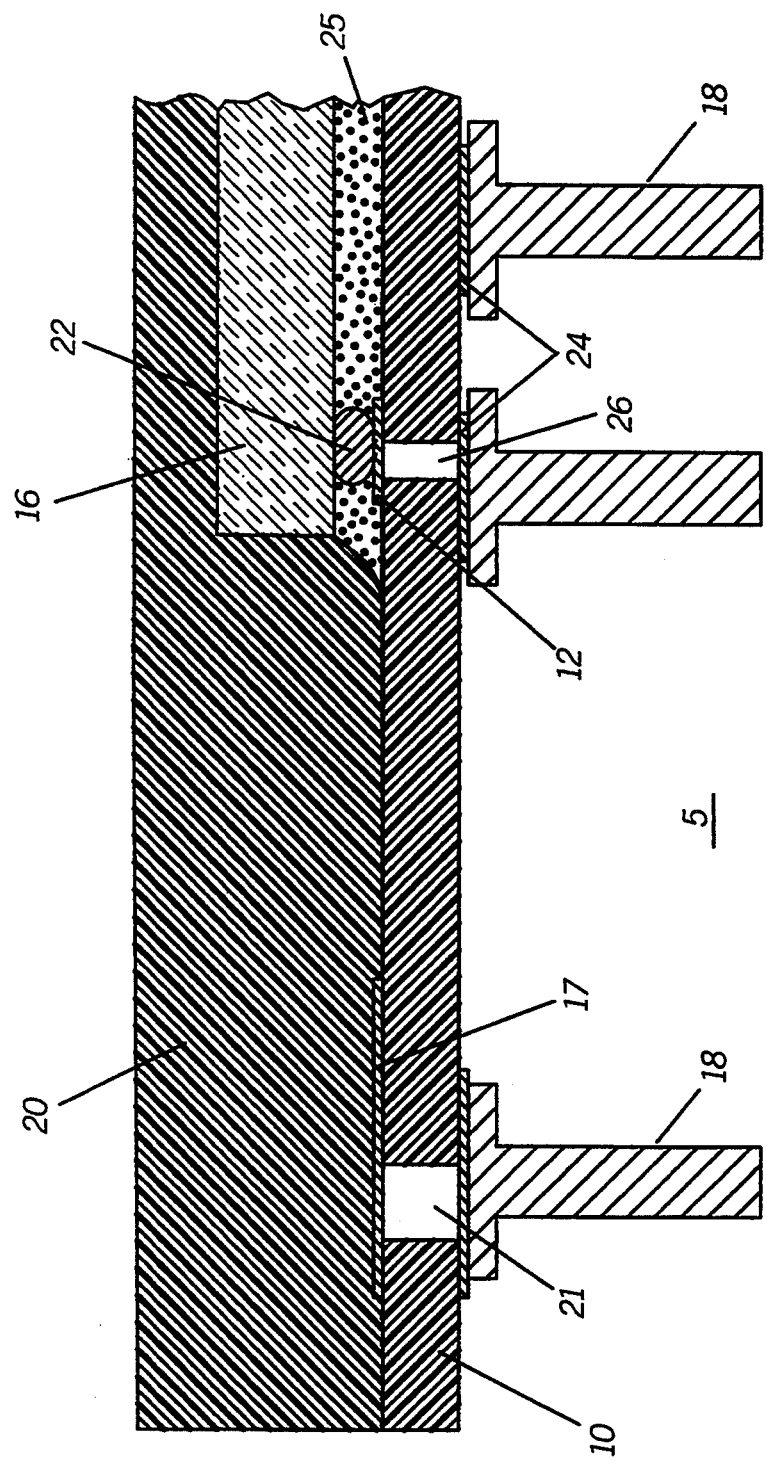
FIG. 5 is a cross-sectional view of an alternate embodiment of the invention.

Referring now to FIG. 4, it may be seen that a conventional heat sink 29 such as a cast, stamped, or extruded metal structure may be attached to the top of package 5. Heat sink 29 is typically attached by means of a thermally-conductive material 27, such as thermal grease or solder. Because the overmold compound 20 has a high amount of metallic filler, the metal heat sink 29 can be soldered or welded directly to the molding compound 20.

Figure 6:
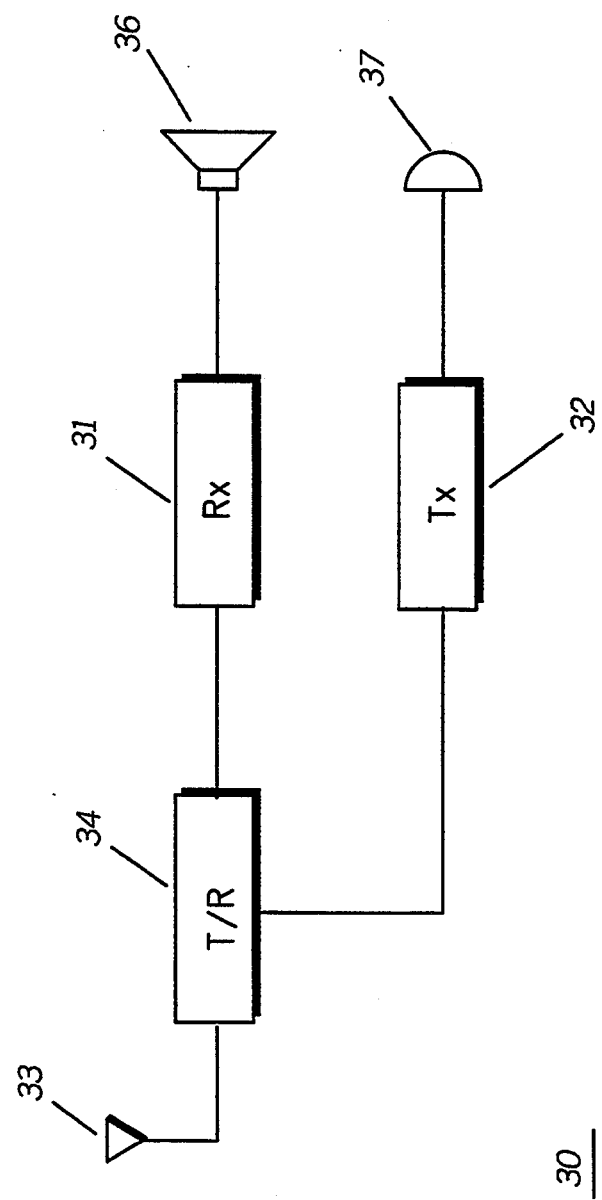
FIG. 6 is a block diagram of a radio in accordance with the invention.

In a further embodiment of the invention, the electronic package as described herein may find particular use in portable communications applications. Referring to FIG. 6, the RF shielded thermally conductive integrated circuit package 5 of the present invention is utilized in a radio 30 comprising any well-known radio, such as portable two-way radios manufactured by Motorola Inc., which may operate in either receive or transmit modes. The radio 30 includes a receiver section 31 and a transmitter section 32 which comprise means for communicating, that is, transmitting or receiving communication signals for the radio.

In the receive mode, the portable radio 30 receives a communication signal via an antenna 33. A transmit/receive (T/R) switch 34 couples the received communication signal to the receiver 31. The receiver 31 receives and demodulates the received communications signal and presents its audio component to a speaker 36. It may be appreciated by one of ordinary skill in the art that other functions not herein described may be provided by any suitable means, including a controller means (not shown), which controls the entire operation of the radio 30.

In the transmit mode, audio messages are coupled from a microphone 37, where they are used to modulate a carrier signal as is well known in the art. The modulated carrier signal is then applied to the antenna 33 through the T/R switch 34 for transmission of the communication signal. It may be appreciated that the RF shielded thermally conductive integrated circuit package 5, according to the principals of the present invention, may be utilized in suitable sections of the transmitter or receiver sections 32 and 31, respectively.

In summary, a monolithic integrated circuit package is formed, comprising a thermally and electrically conductive epoxy that encapsulates at least one semiconductor device or integrated circuit in order to reduce the transfer of unwanted radio frequency energy into or out of the semiconductor package. In addition, the thermally-conductive material provides enhanced heat sinking capability in order to provide an improved package for flip-chip mounting of power RF die. The electrically-conductive molded compound is electrically coupled to a point on the circuit substrate corresponding to a ground plane and forms an RF shield without subjecting the IC to excessive heat. Fins or other projections may be easily molded into the thermally and electrically conductive molding compound in order to provide improved cooling.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A semiconductor device package, comprising:
   a leadless circuit carrying substrate having two opposed sides, a first side having a metallization pattern, one portion of the metallization pattern being a circuit ground, and a second side having a substantially coplanar array of surface mount solder pads, the metallization pattern being electrically connected to the surface mount solder pads by means of at least one conductive via through the leadless circuit carrying substrate;
   an integrated circuit die flip-chip mounted on the metallization pattern and the first side of the leadless circuit carrying substrate;
   an underfill adhesive between the integrated circuit die and the first side of the leadless circuit carrying substrate; and
   a thermally and electrically conductive plastic material transfer molded to form a cover and encapsulating the integrated circuit die and a portion of the first side of the leadless circuit carrying substrate, the conductive plastic material electrically coupled to the circuit ground and forming a radio frequency energy shield about the integrated circuit die, and mechanically coupled to the integrated circuit die, forming a heat sink to dissipate heat from the die.

2. The semiconductor device package of claim 1, wherein the cover is smaller than the leadless circuit carrying substrate, thereby exposing a portion of the first side of the leadless circuit carrying substrate about a perimeter of the cover.

3. The semiconductor device package of claim 1, wherein the cover encapsulates all of the first side of the leadless circuit carrying substrate not covered by the integrated circuit die.

4. The semiconductor device package of claim 1, wherein the cover has fins molded into an upper surface.

5. The semiconductor device package of claim 1, further comprising a metal heat sink attached to an upper surface of the cover.

6. The semiconductor device package of claim 1, wherein the thermally and electrically conductive plastic material comprises a thermoset resin filled with metal.

7. The semiconductor device package of claim 1, wherein the leadless circuit carrying substrate is a glass reinforced printed circuit board.

8. The semiconductor device package of claim 1, wherein the leadless circuit carrying substrate is a flexible film selected from the group consisting of polyimide, polyester, or polyetherimide.

9. The semiconductor device package of claim 1, wherein the surface mount solder pads are bumped with solder.

10. The semiconductor device package of claim 1, further comprising metal pins attached to the surface mount solder pads.

11. A thermally conductive integrated circuit package with radio frequency shielding, comprising:
    a printed circuit substrate having two opposed sides, a first side having a metallization pattern, one portion of the metallization pattern being a circuit ground, and a second side having a substantially coplanar array of surface mount solder pads, the metallization pattern being electrically connected to the surface mount solder pads by means of at least one conductive via through the leadless circuit carrying substrate;
    an integrated circuit die flip-chip mounted on the metallization pattern and the first side of the printed circuit substrate by means of metal bumps;
    an underfill adhesive between the integrated circuit die and the first side of the printed circuit substrate; and
    a plastic material filled with metal particles transfer molded to encapsulate and form a cover for the integrated circuit die and a portion of the first side of the printed circuit substrate wherein a portion of the first side of the printed circuit substrate about a perimeter of the cover is revealed, the cover electrically coupled to the circuit ground to shield the integrated circuit die from radio frequency energy, and mechanically coupled to the integrated circuit die to dissipate heat from the die.

12. The thermally conductive integrated circuit package of claim 11, wherein the cover has fins molded into an upper surface.

13. The thermally conductive integrated circuit package of claim 11, further comprising a metal heat sink attached to an upper surface of the cover.

14. The thermally conductive integrated circuit package of claim 11, further comprising solder bumps on the surface mount solder pads.

15. An electronic component assembly, comprising:
an electronic component having a plurality of terminals;
an electronic component carrier including a substrate having first and second opposed major surfaces, and a conductive pattern on the first major surface for receiving the electronic component, and at least one ground pad on the same major surface as the conductive pattern;
the electronic component flip-chip bonded to the conductive pattern of said electronic component carrier;
an underfill adhesive between the electronic component and the first major surface; and
a thermally and electrically conductive plastic material transfer molded to form a cover and encapsulate the electronic component and a portion of the first major surface, the conductive plastic material electrically coupled to the ground pad to provide a shield for substantially reducing the ingress or egress of radio frequency signals through the cover, and mechanically coupled to the electronic component to dissipate heat from the electronic component.

16. A radio, ,comprising a transmitter, said transmitter having a heat producing amplifier, comprising:
a leadless circuit carrying substrate having two opposed sides, a first side having a metallization pattern, one portion of the metallization pattern being a circuit ground, and a second side having a substantially coplanar array of surface mount solder pads, the metallization pattern being electrically connected to the surface mount solder pads by means of at least one conductive via through the leadless circuit carrying substrate;
an integrated circuit flip-chip mounted on the metallization pattern and the first side of the leadless circuit carrying substrate by means of metal bumps;
an underfill adhesive between the integrated circuit and the first side of the leadless circuit carrying substrate; and
a thermally and electrically conductive plastic material transfer molded to form a cover and encapsulate the integrated circuit and a portion of the first side of the leadless circuit carrying substrate, the conductive plastic material electrically coupled to the circuit ground to shield the integrated circuit from radio frequency energy and mechanically coupled to the integrated circuit to dissipate heat from the integrated circuit.

* * * * *